(12) United States Patent
Dao et al.

(10) Patent No.: US 6,548,417 B2
(45) Date of Patent: Apr. 15, 2003

(54) IN-SITU BALANCING FOR PHASE-SHIFTING MASK

(75) Inventors: Giang Dao, Fremont, CA (US); Qi-De Qian, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/957,571

(22) Filed: Sep. 19, 2001

(65) Prior Publication Data

US 2003/0054260 A1 Mar. 20, 2003

(51) Int. Cl.[7] ............... H01L 21/302; H01L 21/461; G03F 9/00; G03C 5/00
(52) U.S. Cl. ............... 438/710; 438/685; 438/720; 430/5; 430/322; 430/323
(58) Field of Search ................. 438/710, 763, 438/685, 720; 430/5, 322, 323

(56) References Cited

U.S. PATENT DOCUMENTS

| | | | | |
|---|---|---|---|---|
| 5,656,397 A | * | 8/1997 | Imai et al. ............ | 430/5 |
| 5,885,735 A | * | 3/1999 | Imai et al. ............ | 430/5 |
| 5,932,377 A | * | 8/1999 | Ferguson et al. ...... | 430/5 |
| 5,932,489 A | * | 8/1999 | Huang ................. | 438/717 |
| 5,976,968 A | * | 11/1999 | Dai .................... | 438/622 |
| 6,458,495 B1 | * | 10/2002 | Tsai et al. ............ | 430/5 |

* cited by examiner

*Primary Examiner*—Alexander Ghyka
(74) *Attorney, Agent, or Firm*—George Chen

(57) ABSTRACT

The present invention describes a method of forming a mask comprising: providing a substrate, the substrate having a first thickness; forming a balancing layer over the substrate, the balancing layer having a second thickness; forming an absorber layer over the balancing layer, the absorber layer having a first region separated from a second region by a third region; removing the absorber layer in the first region and the second region; removing the balancing layer in the second region; and reducing the substrate in the second region to a third thickness. The present invention also describes a mask comprising: an absorber layers the absorber layer having a first opening and a second opening, the first opening uncovering a balancing layer disposed over a substrate having a first thickness, and the second opening uncovering the substrate having a second thickness.

7 Claims, 3 Drawing Sheets

1000 →

IN-SITU BALANCING FOR PHASE-SHIFTING MASK

BACKGROUND OF THE INVENTION

1. Field of the Invention

The present invention relates to the field of semiconductor integrated circuit manufacturing, and more specifically, to a phase-shifting mask and a process for fabricating a phase-shifting mask.

2. Discussion of Related Art

Improvements in photolithography have increased the density and enhanced the performance of semiconductor devices by shrinking integrated circuits (ICs). As described by the Rayleigh criterion, the minimum critical dimension (CD) which can be resolved by a wafer stepper is directly proportional to the wavelength of the illumination source and inversely proportional to the numerical aperture (NA) of the projection lens. However, diffraction tends to degrade the aerial image when the CD becomes smaller than the actinic wavelength. The actinic wavelength is the wavelength of light at which a mask is used in a wafer stepper to selectively expose photoresist coated on a substrate, such as a Silicon wafer. As needed, a resolution enhancement technique (RET), such as a phase-shifting mask (PSM), may be used to achieve a wider process latitude. Unlike a binary mask that only uses Chrome to control the amplitude of light transmitted through a quartz substrate, a PSM further modulates the phase of light to take advantage of destructive interference to compensate for the effects of diffraction.

An alternating PSM (AltPSM) is a type of PSM that is particularly helpful in improving contrast when patterning very small CDs, such as the gate length of a transistor in a device. AltPSM introduces a phase shift of 180 degrees between the light transmitted through adjacent clear openings so destructive interference can force the amplitude between the two images to zero. A phase shift of 180 degrees is implemented by creating a difference in the optical path lengths through adjacent openings in an opaque layer, such as Chrome. A subtractive process may be used to etch a trench into the quartz substrate in alternate openings. However, incident light may scatter off the sidewalls and bottom corners of the etched trench and cause an imbalance in the aerial image that varies as a function of focus. Such a waveguide effect may be manifested as a CD error and a placement error.

The intensity and phase in the aerial image of an AltPSM may be balanced in various ways. A selective biasing approach enlarges the CD of the etched opening relative to the unetched opening to balance the aerial image. An etchback approach undercuts the edges of the chrome in both openings to balance the aerial image. A dual-trench approach etches a deep trench in the phase-shifted opening and a shallow trench in the non-phase-shifted opening to balance the aerial image.

Each approach for balancing the aerial image has drawbacks. The selective biasing approach may be limited to the discrete values available on the design grid unless a gray beam-writing scheme is used. The etchback approach may result in defects, such as chipping or delamination of the overhanging chrome between adjacent openings. The dual-trench approach adds complexity and cost by requiring additional processing.

Thus, what is needed is a phase-shifting mask (PSM) having in situ balancing of intensity and phase and a method of forming such a PSM.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes an alternating phase-shifting mask (AltPSM) having in situ balancing of intensity and phase and a method of forming such a phase-shifting mask (PSM). A method of fabricating an AltPSM, according to the present invention, will also be described.

Figure 1A:
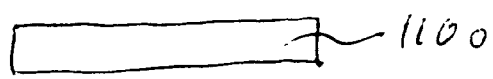
FIGS. 1(a)–(d) is an illustration of a method of forming a mask blank with a balancing layer according to the present invention.

A mask is built from a substrate 1100, such as quartz, that is transparent at the actinic wavelength. The actinic wavelength is the wavelength of light used in a wafer stepper to selectively expose photoresist on a wafer. An embodiment is shown in FIG. 1(a).

Figure 1B:

A balancing layer 1200 is formed over the substrate 1100. An embodiment is shown in FIG. 1(b). The thickness of the balancing layer 1200 is typically about 3.0–70.0 nm. Direct current (DC) magnetron sputtering may be used to form the balancing layer 1200.

The balancing layer 1200 is formed from a material that is transmissive and may be capable of phase-shifting. Transmission is usually a function of wavelength and may be measured in a tool, such as the n&k Analyzer 1280 from n&k Technology, Inc. The material, structure, and thickness of the balancing layer 1200 are chosen so that the transmission through the non-phase-shifted opening 1410 is modified, such as reduced, just enough to match the transmission through the adjacent phase-shifted opening 1420. The modification in transmission may be about 1.5–12.0 percent. This will achieve the goal of matching the intensity of light transmitted through the two adjacent openings.

In addition to having suitable optical properties, the balancing layer 1200 must possess chemical resistance, radiation durability, and compatibility with the underlying substrate 1100 and the overlying mask absorber layer 1300. Phase and transmission should not be appreciably affected by the mask fabrication process, the mask inspection or repair process, or the mask cleaning process. In most cases, the balancing layer 1200 should have a low film stress.

The balancing layer 1200 may be formed from an elemental metal, such as Gold, or from suitable compounds, including Fluorides, Silicides, Oxides, or Nitrides of materials, such as Aluminum, Chromium, Hafnium, Molybdenum, Nickel, Niobium, Tantalum, Titanium, Tungsten, or Zirconium. Examples include Chromium Fluoride ($CrO_xF_y$), Zirconium Silicon Oxide ($ZrSi_xO_y$), Molybdenum Silicon Oxide ($MoSi_xO_y$), Aluminum Nitride ($Al_xN_y$), or Silicon Nitride ($Si_xN_y$).

In some embodiments, one or more of the materials forming the balancing layer 1200 may be non-stoichiometric. For example, Oxygen may be present in small quantities or may be absent. In other embodiments, the balancing layer 1200 may be non-homogeneous. In still other embodiments, the balancing layer 1200 may be a multilayer.

Figure 1C:
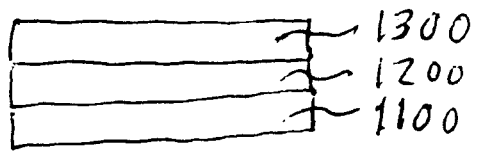

An absorber layer 1300 is formed over the balancing layer 1200. The result is a mask blank 1000, with an embodiment being shown in FIG. 1(c). The absorber layer 1300 is opaque at the actinic wavelength with an optical density (OD) of about 2.5 to 4.0. The absorber layer 1300 has a thickness of about 60.0–80.0 nm. The absorber layer 1300 may be thinner if it is formed out of a material with a larger extinction coefficient (k).

The absorber layer 1300 may be formed from a metal, such as Chromium. The absorber layer 1300 may also be formed from a refractory metal, such as Molybdenum, Tungsten, or a related alloy or compound. Other materials, such as amorphous Carbon or amorphous Silicon, may also be used.

The absorber layer 1300 may include certain materials to provide desired properties. One example is the inclusion of certain materials in the bulk of the absorber layer 1300 to reduce stress, or prevent pinholes, or minimize edge roughness.

A graded or multilayer structure may be desirable for the absorber layer 1300. An example is the inclusion of other materials at the upper surface of the absorber layer 1300 to decrease reflectivity below 10% at the actinic wavelength so as to minimize flare, or scattered light, when the mask 1020 is used in a wafer stepper. Still another example is the inclusion of some materials at the lower surface of the absorber layer 1300 to improve adhesion. The lower surface of the absorber layer 1300 is located over the balancing layer 1200. In one embodiment, the absorber layer 1300 is Chromium Oxynitride at the upper surface, Chromium in the middle, and Chromium oxide at the lower surface.

Figure 1D:
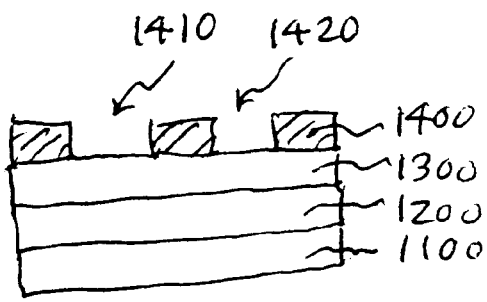

A first-level photoresist 1400 is applied over the absorber layer 1300 on the mask blank 1000, with an embodiment being shown in FIG. 1(d). The first-level photoresist 1400 should have high resolution and good CD linearity as well as good dry etch resistance. The first-level photoresist 1400 may have a thickness of about 160–640 nm. A chemically amplified resist (CAR) may be used if high sensitivity to radiation is desired to increase throughput. The first level photoresist 1400 is usually an e-beam photoresist so an e-beam writer may be used to pattern images in the photoresist. The system configuration may be chosen to achieve finer resolution and higher pattern fidelity. For example, vector scan of an e-beam with an acceleration voltage of 40–50 keV may be preferable over raster scan of an e-beam with an acceleration voltage of 10–20 keV.

Reactive Ion etch (RIE) may be performed in a parallel plate reactor with high plasma density and low gas pressure. The dry etch chemistry may be based on Chlorine, such as $Cl_2/O_2$ or $BCl_3$. In some cases, it may be advantageous to add an assist gas, such as $H_2$ or HCl, since Hydrogen radicals can scavenge excess Chlorine radicals. If appropriate, in-situ descum, such as with Oxygen, may be done to remove residue in the images in the photoresist prior to RIE.

Loading effects in the RIE may affect etch rates, etch uniformity, and etch selectivity. It is desirable to increase etch selectivity so as to minimize erosion of the first-level photoresist 1400. Sidewall passivation can help control the etch profile and the etch bias. Helium may be added to increase plasma density, reduce DC bias, and increase the selectivity over the first-level photoresist 1400.

Figure 2A:
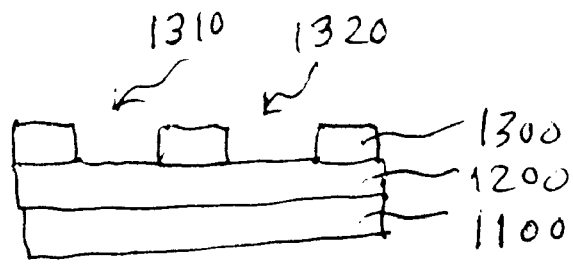
FIGS. 2(a)–(c) is an illustration of a method of forming an alternating phase-shifting mask with a balancing layer located below the absorber layer and in the non-phase-shifted opening according to the present invention.

The absorber layer 1300 is usually etched without appreciably etching the underlying balancing layer 1200. An embodiment is shown in FIG. 2(a). The etch is predominantly anisotropic to produce mostly vertical profiles in the sidewall of the openings 1310 and 1320. After removal of the first-level photoresist 1400, the CD of the etched features 1310 and 1320 are measured with a Scanning Electron Microscope (SEM).

The etched features are inspected for defects. Defect inspection may be based on a comparison of two nominally identical patterns printed in different portions of the mask (die-to-die) or based on a comparison of a pattern printed on the mask and the layout data corresponding to the pattern (die-to-database). A focused ion beam (FIB) tool, such as a Micrion-8000EX from the FEI Company, may be used to repair an opaque defect using physical ion sputtering or gas-assisted etch (GAE).

Further processing is performed to introduce a phase shift of 180 degrees between light transmitted through adjacent openings. An additive process (not shown) may be used. In an additive process, a transparent layer, such as spin-on-glass (SOG), is deposited through openings in the absorber layer onto the substrate, such as fused silica or quartz, followed by removal of the transparent layer in alternate openings.

Figure 2B:
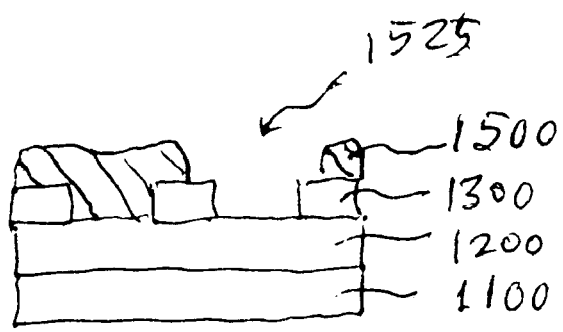

An additive process is susceptible to optical mismatch of materials in the light path and accompanying internal losses at the interfaces so, in many cases, a subtractive process is preferred. After the first-level photoresist 1400 is stripped, a second-level photoresist 1500 is applied. An embodiment is shown in FIG. 2(b). The second-level photoresist 1500 may have a thickness of about 300–600 nm.

The second-level photoresist 1500 is usually an optical photoresist which is patterned with a laser writer that uses raster scan with multiple beams of deep ultraviolet (DUV) light. Laser written features are susceptible to corner rounding and CD nonlinearity so laser proximity correction is usually incorporated to improve pattern fidelity. Laser writing is typically performed with multiple passes to average out subsystem errors that may otherwise adversely affect stripe butting, placement linearity, edge roughness, and CD uniformity.

The opening 1310 that will be non-phase-shifted is covered by the second-level photoresist 1500. The opening 1320 that will be phase-shifted is uncovered by exposing and developing a larger opening 1525 in the second-level photoresist 1500. An embodiment is shown in FIG. 2(b).

The larger opening 1525 in the second-level photoresist 1500 is aligned to the etched opening 1320 in the absorber layer 1300. The larger opening 1525 is biased larger than the etched opening 1320 so as to accommodate registration errors, CD errors, and overlay tolerances in photolithography and etch. Thus, the placement of the larger opening 1525 in the second-level photoresist 1500 in relation to the etched opening 1320 is not very critical since the edge of the etched opening 1320 in the absorber layer 1300, and not the edge of the larger opening 1525 in the second-level photoresist 1500, will determine the width 1155 of the trench 1125. The width 1155 may be measured top-down in a SEM.

After the second-level photoresist 1500 is exposed and developed, RIE is performed with chemistry based on Fluorine, such as $CHF_3$, $CF_4/He/O_2$, or $SF_6/He$. The etch may be done in a high-pressure Inductively Coupled Plasma (ICP) system or a Magnetically Enhanced Reactive Ion Etching (MERIE) system. The etch is anisotropic and creates a trench in the etched opening. The depth of the trench corresponds to a phase shift of 180 degrees in the light that will be transmitted through the etched opening 1125 relative to the light that will be transmitted through the unetched opening 1310.

It may be desirable to use a voting technique to create a phase shift of 180 degrees between adjacent openings. Voting involves performing a process in several smaller steps instead of in one large step so that any spatial or temporal non-uniformity in the process may be smoothed out. In particular, voting significantly improves control of the depth of the trench, and thus the phase shift, by reducing the impact of any extraneous material that may block the etch.

In one embodiment, a triple-voting technique may be used. In other words, the etch of the quartz substrate 1100 through the opening 1320 is separated into three shorter etches. Each of the shorter etches in the voting technique produces a phase shift, or phase angle, of about 60 degrees. Each of the shorter etches is preceded by application, exposure, and developing of an opening 1525 in a second-level photoresist 1500. The first of the shorter etches will include removal of the balancing layer 1200 in the opening 1320 before etching into the quartz substrate 1100. The second and third of the shorter etches will only include etching deeper into the quartz substrate 1100.

The photoresist is stripped after each of the shorter etches so the phase angle and the intensity may be measured. The etch times may be adjusted as needed based on feedback from the measurements. It is desirable for the phase angle to have a range of less than 2.0 degrees and the intensity to have a range of less than 0.2%. The phase angle may be measured on a tool, such as the MPM-248 or the MPM-193 from Lasertech Corp. The intensity may be measured on a tool, such as the MSM100 Aerial Image Measurement System (AIMS) or MSM193 AIMS from Carl Zeiss. The values selected for the numerical aperture (NA) and the partial coherence should be similar to the values on the wafer stepper in which the mask will subsequently be used.

After stripping the second-level photoresist 1500 for the third time (when using a triple-voting technique), a plasma process or a wet process may be used to clean up the substrate 1100 and remove any undesirable film or defect that may be present. A shorter or less aggressive version of a conventional isotropic wet etch may also be used to remove defects.

Figure 2C:
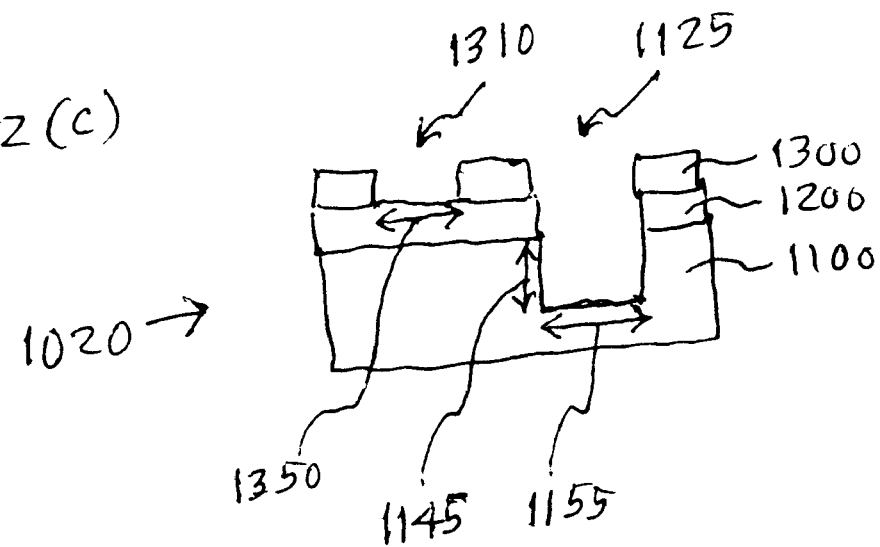

FIG. 2(c) shows an embodiment of an alternating PSM 1020 having in situ balancing of intensity and phase. The phase-shifted opening 1125 has an etch depth of 1145 in the substrate 1100. Underetching or overetching the substrate 1100 will introduce errors in phase angle. Errors in the phase shift, or phase angle, can accumulate and significantly reduce the depth of focus (DOF) of isolated features. However, phase errors usually have a relatively minor effect on the DOF of dense features.

The etch depth 1145 in the substrate 1100 and the sidewall profile of the etched opening 1125 may be determined by measuring the overall step height with an Atomic Force Microscope (AFM) and taking into account the thickness of the absorber layer 1300 and the thickness of the balancing layer 1200. Deviation of the sidewall profile from the vertical may also reduce the DOF for isolated features.

The sidewall of the trench 1125 should be smooth, with a slope of 85–90 degrees. The bottom surface of the etched trench 1125 should be flat and smooth, but, in some cases, the bottom surface may be concave or convex and rough (not shown). The bottom corners of the trench 1125 may be rounded (not shown). Deviations and non-uniformities in the size and shape of the trench 1125 will introduce errors in intensity and phase of the transmitted light.

In most cases, the balancing layer 1200 is left intact in the non-phase-shifted opening 1310. However, if necessary, such as when the etch depth 1145 is slightly too shallow or slightly too deep, it may be desirable to compensate by adjusting, such as by reducing, the thickness of the balancing layer 1200 in the non-phase-shifted opening 1310 so as to balance the intensity and phase of the light transmitted through the non-phase-shifted opening 1310 relative to the light transmitted through the phase-shifted opening 1125.

Other embodiments include embedding an intermediate layer (not shown) to serve as an etch stop for the etch into the quartz substrate. However, any additional layer may add complexity and affect the aerial image unless it is completely removed prior to completion of fabrication.

Another embodiment of the present invention includes a phase-shifting mask (PSM) having in situ balancing of transmission and phase. Such a mask may be transmissive or reflective. The mask may be used with deep ultraviolet (DUV) light or with extreme ultraviolet (EUV) light.

Figure 3:
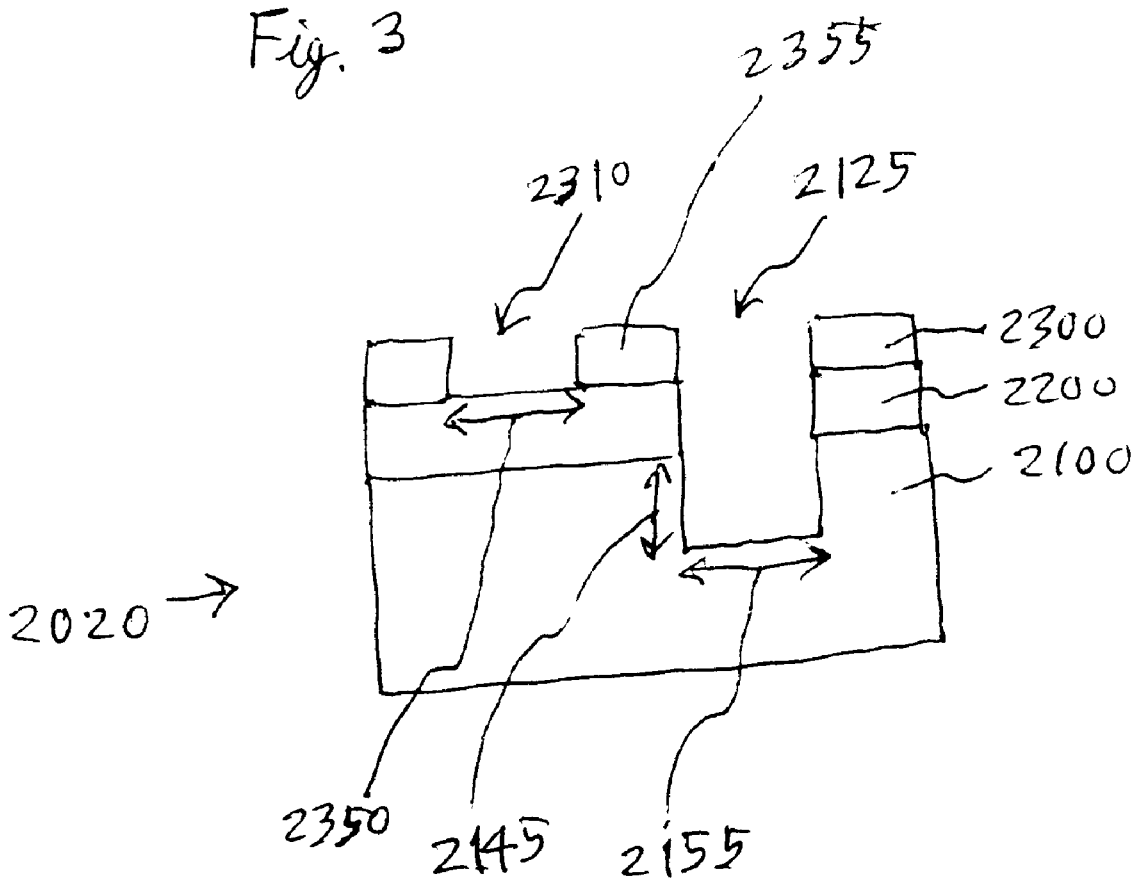
FIG. 3 is an illustration of an alternating phase-shifting mask with in situ balancing according to the present invention.

One embodiment of the present invention is a transmissive, alternating phase-shifting mask, as shown in FIG. 3. The AltPSM 2020 has a substrate 2100 that is transparent to light at the actinic wavelength. The actinic wavelength is the wavelength of light used in a wafer stepper to selectively expose photoresist on a wafer.

Fused silica, or quartz, is commonly chosen for the substrate 2100 at an actinic wavelength in the range of about 193–436 nanometers (nm). Modified fused silica, such as low-hydroxyl-content fused silica or fluorine-doped silica, may be used at short actinic wavelengths, such as about 157 nm.

Alternatively, a crystalline fluoride, such as Calcium Fluoride, may be used at short actinic wavelengths, such as about 126 nm. However, a crystalline fluoride often possesses characteristic properties, such as birefringence, large coefficients of thermal expansion, and low resistance to chemical etches. Compensation for any undesirable property may be accomplished with appropriate design of the optics subsystem and the wafer stepper system.

A balancing layer 2200 is disposed over the substrate 2100. The balancing layer 2200 may have a single-layer structure or a multilayer structure. The balancing layer 2200 should be thin, such as about 3.0–70.0 nm, to reduce absorption. The balancing layer 2200 is partially transmissive and may be capable of phase-shifting. Transmission is usually a function of wavelength and may be measured in a tool, such as the n&k Analyzer 1280 from n&k Technology, Inc.

In addition to having suitable optical properties, the balancing layer 2200 must possess sufficient chemical resistance, radiation durability, and compatibility with the underlying substrate 2100 and the overlying absorber layer 2300. Phase and transmission should not be appreciably affected by the mask fabrication process, the mask inspection or repair process, or the mask cleaning process. The balancing layer 2200 may include materials, such as Chromium Fluoride ($CrO_xF_y$), Zirconium Silicon Oxide ($ZrSi_xO_y$), or Molybdenum Silicide (MoSi). Other materials include Fluorides, Silicides, and Nitrides of metals, such as Aluminum, Chromium, Hafnium, Molybdenum, Nickel, Niobium, Tantalum, Titanium, Tungsten, or Zirconium.

An absorber layer 2300 is disposed over the balancing layer 2200. The absorber layer 2300 is opaque at the actinic wavelength with an optical density (OD) of about 2.5–4.0. The absorber layer 2300 has a thickness of about 60.0–180.0 nm. The absorber layer 2300 may be thinner if it has a larger extinction coefficient (k).

The absorber layer 2300 may be a metal, such as Chromium. The absorber layer 2300 may also be a refractory metal, such as Molybdenum or Tungsten, or a related alloy or compound. The absorber layer 2300 may also be a material such as amorphous Carbon or amorphous Silicon.

In one embodiment, the absorber layer 2300 is Chromium. A graded structure or a multilayer structure may be desirable. For example, inclusion of Oxygen towards the lower surface of the absorber layer 2300 will improve adhesion to the balancing layer 2200 below. Inclusion of Oxygen and Nitrogen towards the upper surface of the balancing layer 2200 can reduce reflectivity below 10% at the actinic wavelength, thus minimizing flare, or scattered light, when the mask 2020 is used in a wafer stepper.

The phase-shifted opening 2125 includes a trench in a first portion of the substrate. The trench in the first portion of the substrate has a width 2155 and a depth 2145. The adjacent non-phase-shifted opening 2310 includes the balancing layer 2200 over a second portion of the substrate with a width 2350. There is no trench in the second portion of the substrate in one embodiment. In another embodiment, there is a shallow trench (not shown) in the second portion of the substrate.

The phase-shifted opening 2125 and the non-phase-shifted opening 2310 are separated by a narrow strip 2355 of the absorber layer 2300. In some cases, the narrow strip 2355 may be absent (not shown) between the two openings. Phase edge masks may be used, especially when the openings are very small.

The depth 2145 corresponds to a difference in the optical path length of light transmitted through the transparent substrate 2100 between the phase-shifted opening 2125 and the non-phase-shifted opening 2310. A phase shift of 180 degrees is desired with a range of less than 2.0 degrees. The depth 2145 has about the same magnitude as the illumination wavelength when the transparent substrate 2100 is quartz and the ambient is air.

In a wafer stepper, Numerical Aperture (NA) of the projection lens and partial coherence of the exposure light will determine the diffraction around the absorber layer 2300 at the edges of the trench 2125. A wafer stepper typically has an NA of 0.45 to 0.80 and a partial coherence of 0.30 to 0.90. Consequently, the optimal difference in the optical path length through the transparent substrate 2100 may vary, depending on the trench depth 2145 and the trench width 2155.

The sidewall of the trench 2125 should be smooth, with a slope of 85–90 degrees. The bottom surface of the etched trench 2125 should be flat and smooth, but, in some cases, the bottom surface may be concave or convex and rough (not shown). The bottom corners of the trench 2125 may be rounded (not shown). Deviations and non-uniformities in the size and shape of the trench 2125 will introduce errors in intensity and phase of the transmitted light.

In still other embodiments, certain intermediate or embedded layers (not shown) may be disposed between the absorber layer 2300 and the balancing layer 2200. Intermediate or embedded layers (not shown) may also be disposed between the balancing layer 2200 and the substrate 2100.

Optical Proximity Correction (OPC) may be included in the mask 2020 claimed in the present invention. OPC involves the biasing of CDs to compensate for print bias and etch bias. It is often helpful to iteratively simulate the aerial image resulting from using PSM with OPC. It can also be helpful to combine the mask 2020 claimed in the present invention with Off-Axis Illumination (OAI) to enhance certain types of features and layouts.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a phase-shifting mask (PSM) having in situ balancing of intensity and phase and a method of forming such a PSM.

We claim:

1. A method comprising:

providing a substrate, said substrate having a first thickness;

forming a balancing layer over said substrate, said balancing layer having a second thickness;

forming an absorber layer over said balancing layer, said absorber layer having a first region separated from a second region by a third region;

removing said absorber layer in said first region and said second region;

removing said balancing layer in said second region; and reducing said substrate in said second region to a third thickness.

2. The method of claim 1 wherein said substrate comprises quartz.

3. The method of claim 1 wherein said balancing layer comprises Chromium Fluoride.

4. The method of claim 1 wherein said absorber layer comprises Chromium.

5. The method of claim 1 wherein light transmitted through said first region and light transmitted through said second region have a phase shift of 180 degrees.

6. The method of claim 1 wherein light transmitted through said first region and light transmitted through said second region are matched in intensity.

7. The method of claim 1 further reducing said balancing layer in said first region to a fourth thickness.

* * * * *

UNITED STATES PATENT AND TRADEMARK OFFICE
CERTIFICATE OF CORRECTION

PATENT NO. : 6,548,417 B2
DATED : April 15, 2003
INVENTOR(S) : Dao et al.

It is certified that error appears in the above-identified patent and that said Letters Patent is hereby corrected as shown below:

<u>Title page,</u>
Item [57], ABSTRACT,
Line 11, after "an absorber", delete "layers", insert -- layer, --.

Signed and Sealed this

Fourth Day of May, 2004

JON W. DUDAS
*Acting Director of the United States Patent and Trademark Office*